(12) United States Patent
Malek et al.

(10) Patent No.: US 9,743,564 B2
(45) Date of Patent: Aug. 22, 2017

(54) ELECTROMAGNETIC SHIELDING STRUCTURES

(71) Applicant: Apple Inc., Cupertino, CA (US)

(72) Inventors: Shayan Malek, San Jose, CA (US); David A. Pakula, San Francisco, CA (US); Gregory N. Stephens, Sunnyvale, CA (US); Jason Sloey, Austin, TX (US)

(73) Assignee: Apple Inc., Cupertino, CA (US)

( * ) Notice: Subject to any disclaimer, the term of this patent is extended or adjusted under 35 U.S.C. 154(b) by 92 days.

(21) Appl. No.: 14/830,351

(22) Filed: Aug. 19, 2015

(65) Prior Publication Data

US 2016/0066481 A1    Mar. 3, 2016

Related U.S. Application Data

(60) Provisional application No. 62/043,055, filed on Aug. 28, 2014.

(51) Int. Cl.
*H05K 7/00* (2006.01)
*H05K 9/00* (2006.01)
*H05K 1/18* (2006.01)
*H05K 1/02* (2006.01)

(52) U.S. Cl.
CPC ........... *H05K 9/0032* (2013.01); *H05K 1/181* (2013.01); *H05K 1/0216* (2013.01); *H05K 2201/10371* (2013.01); *Y02P 70/611* (2015.11)

(58) Field of Classification Search
USPC ........................................ 361/760, 761, 748
See application file for complete search history.

(56) References Cited

U.S. PATENT DOCUMENTS

| | | | | |
|---|---|---|---|---|
| 4,785,136 A | * | 11/1988 | Mollet | G06F 1/182 |
| | | | | 174/363 |
| 2009/0124126 A1 | | 5/2009 | Cho et al. | |
| 2011/0255250 A1 | * | 10/2011 | Dinh | G03B 15/03 |
| | | | | 361/749 |
| 2014/0376191 A1 | | 12/2014 | Hwang | |
| 2015/0041540 A1 | | 2/2015 | Qu et al. | |

FOREIGN PATENT DOCUMENTS

| | | |
|---|---|---|
| CN | 202041962 | 11/2011 |
| CN | 202435458 | 9/2012 |

* cited by examiner

*Primary Examiner* — Andargie M Aychillhum
(74) *Attorney, Agent, or Firm* — Treyz Law Group, P.C.; G. Victor Treyz; David K. Cole (57) ABSTRACT

An electronic device may have a printed circuit to which electrical components are mounted. Electromagnetic shields may be mounted to the printed circuit over the components to suppress interference. A shield may have a metal frame covered with a conductive fabric. The conductive fabric may cover an opening in the top of the frame. An insulating layer may be formed on the lower surface of the conductive fabric to prevent shorts between components on the printed circuit and the conductive fabric. An insulating cap such as an elastomeric polymer cap may also be formed over each component to provide electrical isolation between the components and the conductive fabric. Shields may be formed by coupling shield cans to subscriber identity module shields or other metal structures in a device. Intervening wall structures may be removed to help provide additional shielding volume.

18 Claims, 12 Drawing Sheets

ELECTROMAGNETIC SHIELDING STRUCTURES

This application claims the benefit of provisional patent application No. 62/043,055 filed on Aug. 28, 2014, which is hereby incorporated by reference herein in its entirety.

BACKGROUND

This relates generally to electronic devices, and, more particularly, to electronic devices that include electrical components.

Electronic devices include electronic components such as integrated circuits and other circuitry. Electronic components may be mounted on printed circuit boards. Metal shielding cans are often used to block electromagnetic interference. In a typical scenario, a metal shielding can is soldered to a printed circuit board so that the metal shielding can overlaps one or more electrical components on the printed circuit board. The components that are shielded in this way are protected from interference from other components in an electronic device. The presence of a shield may also help block electromagnetic interference signals that might otherwise be emitted by the components under the shield.

Conventional shielding cans are often bulky. This can make it difficult or impossible to mount electrical components in a compact electronic device where space is at a premium. At the same time, it may be difficult or impossible to omit shielding to save space, because omission of the shielding could lead to interference that would make device performance unreliable.

It would therefore be desirable to be able to provide compact electromagnetic shielding arrangements for use in an electronic devices.

SUMMARY

An electronic device may have a printed circuit to which electrical components are mounted. Electromagnetic shields may be mounted to the printed circuit over the components to suppress interference. A shield may have a metal frame covered with a conductive fabric. The conductive fabric may cover an opening in the top of the frame. An insulating layer may be formed on the lower surface of the conductive fabric to prevent shorts between components on the printed circuit and the conductive fabric. An insulating cap such as an elastomeric polymer cap may also be formed over each component to provide electrical isolation between the components and the conductive fabric.

Shields may be formed by coupling shield cans to subscriber identity module shields or other metal structures in a device. Intervening wall structures may be removed to help provide additional shielding volume. A subscriber identity module shield and a shield can may be coupled by inserting a horizontally extending planar wall portion into bent tabs formed from bent sidewalls. A subscriber identity module shield and a shield can may also be coupled together using a welded sheet metal member, conductive fabric, or other conductive material.

DETAILED DESCRIPTION

Figure 1:
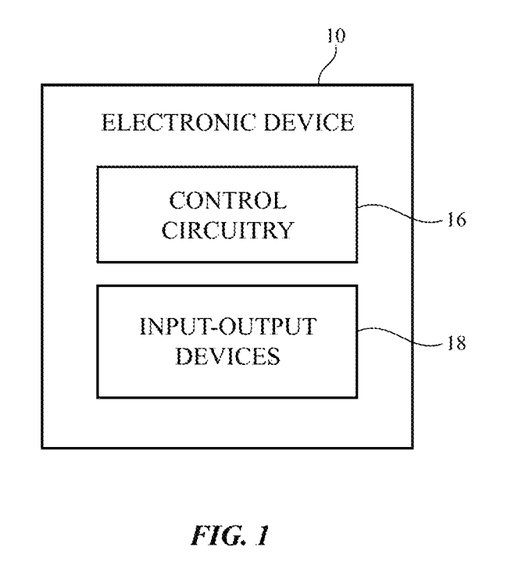
FIG. 1 is a schematic diagram of an illustrative electronic device in accordance with an embodiment.

An illustrative electronic device is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors and other wireless communications circuits, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors such as touch sensors, proximity sensors, ambient light sensors, compasses, gyroscopes, accelerometers, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays. Device 10 may, for example, include a touch screen display that includes a touch sensor for gathering touch input from a user or a display that is insensitive to touch. A touch sensor for a display in device 10 may be based on an array of capacitive touch sensor electrodes, acoustic touch sensor structures, resistive touch components, force-based touch sensor structures, a light-based touch sensor, or other suitable touch sensor arrangements.

Power for device 10 may be provided by an external source of power and/or an internal battery. The components for device 10 such as circuitry 16 and devices 18 and other structures in device 10 may be implemented using integrated circuits, discrete components (e.g., resistors, capacitors, inductors), microelectromechanical systems (MEMS) devices, portions of housing structures, packaged parts, and other devices and structures.

Control circuitry 16 may be used to run software on device 10 such as operating system code and applications. During operation of device 10, the software running on control circuitry 16 may display images for a user on one or more displays and may use other internal components such as input-output devices 18. Device 10 may use communications circuits to send and receive wireless and wired data. For example, device 10 may use light-emitting components to transmit data and may use light-receiving components to receive transmitted light signals. Device 10 may also use light-emitting components, light-receiving components, audio components, capacitive sensors, microelectromechanical systems devices, and other components as sensors and output devices. Device 10 may use wireless circuits in circuitry 16 (e.g., a baseband processor and associated radio-frequency transceiver circuitry) to transmit and receive wireless signals. For example, device 10 may transmit and receive cellular telephone signals and/or wireless local area network signals or other wireless data.

Figure 2:
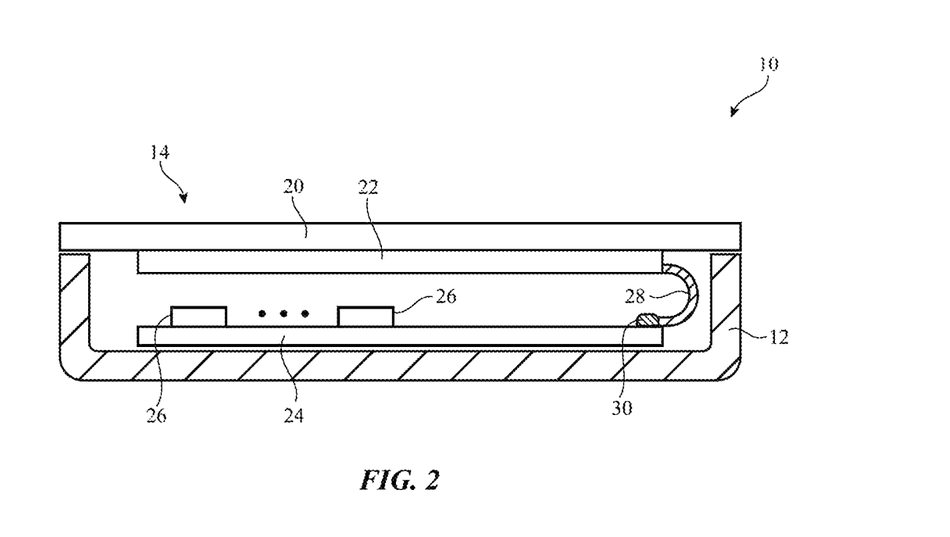
FIG. 2 is a cross-sectional side view of an illustrative electronic device in accordance with an embodiment.

A cross-sectional side view of an illustrative electronic device is shown in FIG. 2. As shown in FIG. 2, device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have inner housing structures that provide additional structural support to device 10 and/or that serve as mounting platforms for printed circuits and other structures. Structural internal housing members may sometimes be referred to as housing structures and may be considered to form part of housing 12.

Device 10 may have a display such as display 14. Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 of device 10 may be formed from a display module such as display module 22 mounted under a cover layer such as display cover layer 20 (as an example). Display 14 (display module 22) may be a liquid crystal display, an organic light-emitting diode display, a plasma display, an electrophoretic display, a display that is insensitive to touch, a touch sensitive display that incorporates and array of capacitive touch sensor electrodes or other touch sensor structures, or may be any other type of suitable display. Display cover layer 20 may be planar or curved and may be formed from clear glass, a transparent plastic member, a transparent crystalline member such as a sapphire layer, clear ceramics, other transparent materials, or combinations of these structures.

Electrical components 26 may be mounted within the interior of housing 12. Components 26 may be mounted to printed circuits such as printed circuit 24. Printed circuit 24 may be a rigid printed circuit board (e.g., a printed circuit board formed from fiberglass-filled epoxy or other rigid printed circuit board material) or may be a flexible printed circuit (e.g., a printed circuit formed from a sheet of polyimide or other flexible polymer layer). Patterned metal traces within printed circuit board 24 may be used to form signal paths between components 26. If desired, components such as connectors may be mounted to printed circuit 24. As shown in FIG. 2, for example, a cable such as flexible printed circuit cable 28 may couple display module 22 to connector 30. Connector 30 may couple cable 28 to traces within printed circuit 24. When coupled as shown in FIG. 2, signals associated with operation of display 14 may pass to display module 22 from signal lines in printed circuit 24 through cable 28 and connector 30.

Figure 3:
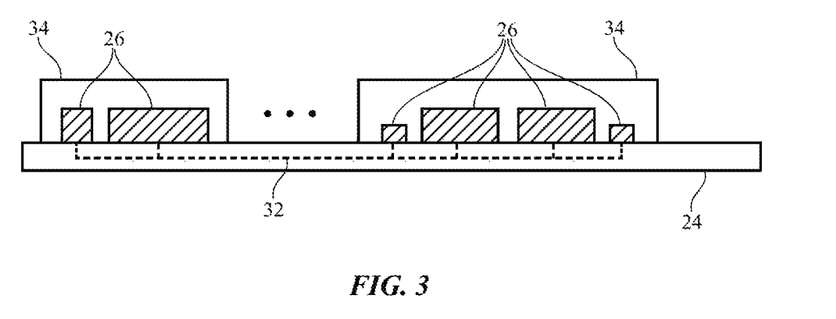
FIG. 3 is a side view of an illustrative printed circuit on which electrical components and shielding structures have been mounted in accordance with an embodiment of the present invention.

Components 26 may be mounted to signal lines in printed circuit 24 using solder or other conductive materials. As shown in FIG. 3, metal traces 32 in printed circuit 24 may be used to interconnect components 26. Metal traces 32 may be formed in one or more metal layers on printed circuit 24 (i.e., printed circuit 24 may be a single layer printed circuit or a multilayer printed circuit). In multilayer printed circuit configurations, metal vias may be used to interconnect metal signal traces on different layers. The patterned metal traces on printed circuit 24 may be used to route signals such as digital signals, analog signals, power signals, ground signals, etc. For example, ground signals may be coupled to conductive structures such as conductive shield structures 34. Each conductive shield structure 34 may be used to electromagnetically shield one or more components 26. The components that are shielded in this way may have one or more different heights (i.e., different vertical dimensions above the surface of printed circuit 24).

Conductive shields 34 may be formed from conductive material. The walls of shields 34 define cavity shapes that are configured to receive components 26 (i.e., shapes that allow shields 34 to be mounted to printed circuit 24 overlapping components 26). The conductive material for conductive shields 34 may be formed into a desired shape using techniques such as stamping, machining, casting, laser cutting, welding, attachment of conductive structures using conductive adhesive or solder, etc. Shields 34 may have a horizontal planar cover and four downwardly extending sidewalls that form an open box shape or may have other shapes and may sometimes be referred to as shield cans.

Figure 4:
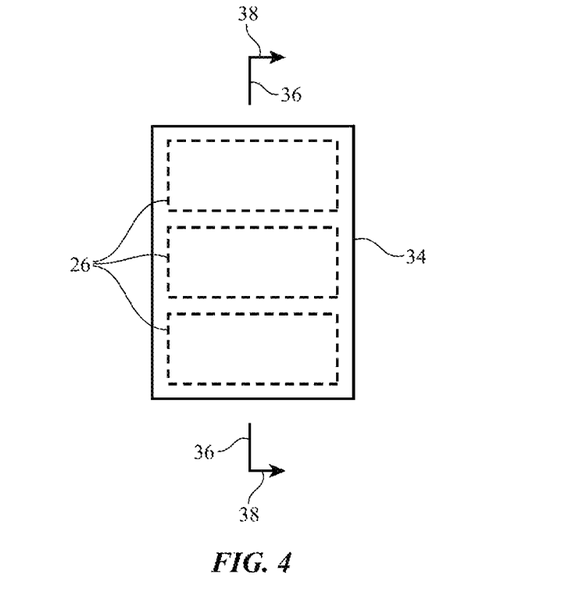
FIG. 4 is a top view of an illustrative rectangular shield covering electrical components on a printed circuit in accordance with an embodiment.
Figure 5:
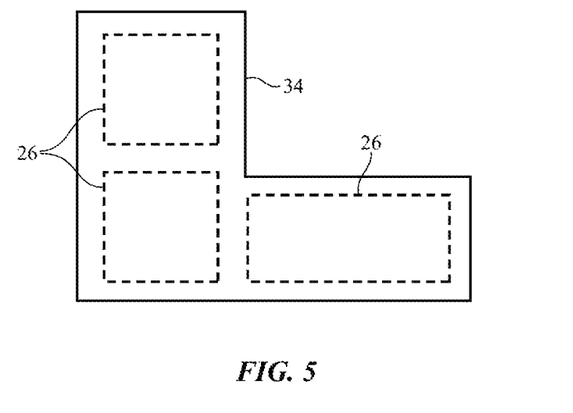
FIG. 5 is a top view of an illustrative L-shaped shield covering electrical components in accordance with an embodiment.

The footprint of each shield 34 may be rectangular in shape or may have other suitable shapes. As shown by the top view of illustrative shield 34 of FIG. 4, shield 34 may have a rectangular outline (when viewed from above) and may overlap multiple components. A top view of an illustrative configuration for shield 34 that has a non-rectangular L-shape is shown in FIG. 5. Other non-rectangular shapes for the outlines of shields 34 may be used if desired (e.g., U-shapes, shapes with curved edges, shapes with combinations of curved and straight edges, non-rectangular shapes with fewer than four sides or more than four sides, etc.). The footprints of shields 34 that are shown in FIGS. 4 and 5 are merely illustrative.

Shields 34 may be formed entirely or primarily of metal or may be formed from a combination of conductive materials (e.g., conductive metal, conductive polymers, conductive intertwined fibers such as conductive fabric, conductive materials that include fibers embedded within a polymer matrix such as carbon-fiber composites and other fiber composite materials, and/or other conductive materials).

In some applications, it may be desirable to minimize the vertical dimensions of some or all of shield 34 (e.g., to minimize shield volume). The height of shield 34 can be minimized by forming an opening in the upper surface of shield 34 and covering the opening with a thin conductive layer. This forms a shield structure with a raised center that may efficiently accommodate a collection of shorter and taller components.

The sidewalls of shield 34 may, as an example, be formed from metal. An opening may be formed in the upper wall of a metal frame structure used in forming shield 34. In a configuration of the type shown in FIG. 4, for example, a rectangular opening may be formed in the upper wall of a rectangular metal can, creating a metal frame formed from four metal vertical sidewalls and an upper wall with a rectangular opening. This rectangular opening may then be covered with a thin conductive material (e.g., a layer of material having a thickness that is less than the sidewall thickness and/or that is less than the wall thickness of the other portions of the metal can or that has any other suitable thickness).

The presence of the thin layer over the opening ensures that components 26 are enclosed within conductive material, thereby ensuring that shield 34 can provide components 26 with satisfactory electromagnetic shielding. The thinness of the thin layer and the variations in interior heights for components 26 within the shield may help reduce the overall size of shield 34.

In general, any suitable conductive material may be used to form the thin covering layer that seals the opening in the upper surface of the metal can (e.g., polymer covered with a metal coating, a thin sheet metal layer, etc.). With one suitable arrangement, which is sometimes described herein as an example, the thin covering layer is formed from a conductive fabric. Fabrics may be formed from woven fibers that form a mesh or other fiber pattern, from fibers that are intertwined using a random pattern, or from other intertwined fiber arrangements. The fabric may be rendered conductive by forming some or all of the fibers in the fabric from metal fibers, by forming some or all of the fibers in the fabric from polymer fibers coated with metal, by incorporating metal particles into a binder material that is used as a matrix to hold the fibers together and/or that is used as a coating on one or more surfaces of the fibers, by coating one or more surfaces of a set of intertwined fibers or interstitial spaces within these fibers with metallic paint or metal (e.g., metal deposited using physical vapor deposition to form a coating layer, etc.), by forming the fibers of the fabric from carbon materials (e.g., carbon nanotubes, other carbon fibers, or other non-metal conductive fibers), by incorporating carbon particles or other conductive particles into the fabric and/or a polymer binder that coats and/or binds the intertwined fibers, or using other suitable techniques for forming conductive fabric.

Figure 6:
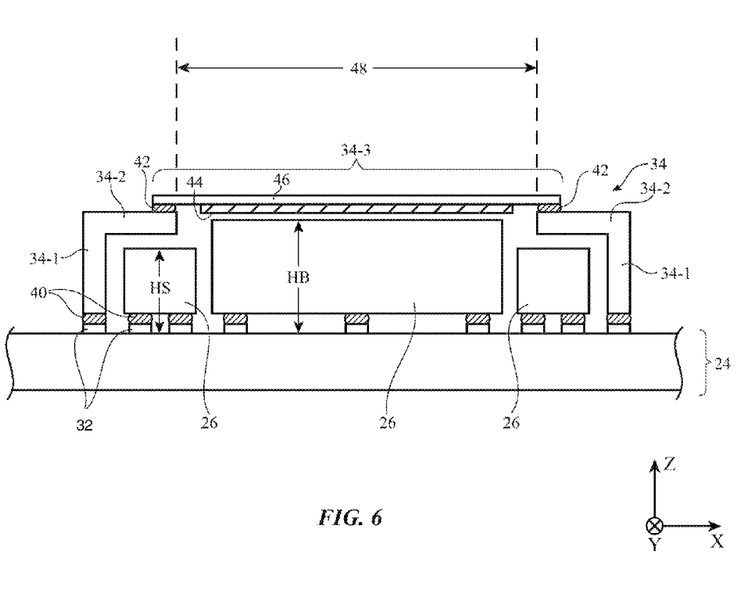
FIG. 6 is a cross-sectional side view of an illustrative shield having a conductive fabric cover in accordance with an embodiment.

A cross-sectional side view of an illustrative shield with a conductive fabric covering layer such as shield 34 of FIG. 4 taken along line 36 and viewed in direction 38 is shown in FIG. 6. As shown in FIG. 6, shield 34 may have covering layer 34-3. Covering layer 34-3 may include conductive fabric layer 46. Insulating layer 44 may be formed on the inner surface of covering layer 34-3 (e.g., on the inner surface of fabric 46) to help prevent components 26 from shorting to conductive fabric 46.

Shield 34 may have metal portions such as metal sidewalls 34-1. Shield 34 may also have upper wall portions such as metal wall portions 34-2 around the perimeter of shield 34. Wall portions 34-2 may lie in the horizontal X-Y plane and may run perpendicular to walls 34-1. Opening 48 may be formed in the upper surface of the metal portion of shield 34 (i.e., within upper wall 34-2). Together, wall portions 34-1 and 34-2 form a metal frame to which fabric 46 may be attached using conductive adhesive 42. If desired, metal wall portions 34-2 can be omitted from the metal frame and fabric 46 can be attached directly to sidewalls 34-1. The configuration of FIG. 6 in which fabric 46 covers opening 48 by attachment to the portions of upper wall 34-2 that run around the rectangular periphery of opening 48 is merely illustrative.

The metal frame of shield 34 may be attached to metal traces on printed circuit 24 such as metal traces 32 using solder 40. Solder 40 may also be used in mounting components 26 to metal traces 32. The metal traces that are connected to the metal frame of shield 34 may be ground traces that ground metal shield 34.

The metal walls of the frame of shield 34 such as metal sidewalls 34-1 and upper metal wall 34-2 may have a thickness that is smaller than the thickness of fabric 46. The thickness of the metal frame may be, for example, about 150 microns, 100-200 microns, more than 100 microns, less than 200 microns, or other suitable thickness and the thickness of fabric 46 may be, for example, about 75 microns, 50-125 microns, more than 50 microns, less than 125 microns, or other suitable thickness.

Because fabric 46 is mounted to the outer surface of wall 34-2, the inner surface of fabric 46 may lie above the inner surface of wall 34-2. This allows taller components such as components of height HB to be mounted in the center of shield 34 where these components are overlapped by fabric 46, whereas shorter components such as components of height HS (less than HB) may be mounted under shorter portions of shield 34 such as the portions of shield 34 under upper wall 34-2. The thinness of fabric 46 helps minimize any increases in shield height in the center of shield 34 covering opening 48 that might result from the presence of fabric 46. As shown in FIG. 6, this type of configuration allows components of different heights to be efficiently shielded under shield 34 and avoids the need to increase the height of shield 34 in peripheral areas such as wall portions 34-2. As a result, wall portions 34-2 may be shorter (and therefore more efficiently mounted within device 10) than would be possible if all of shield 34 were to be constructed with a metal upper wall sufficient in height to accommodate tall components of height HB.

Figure 7:
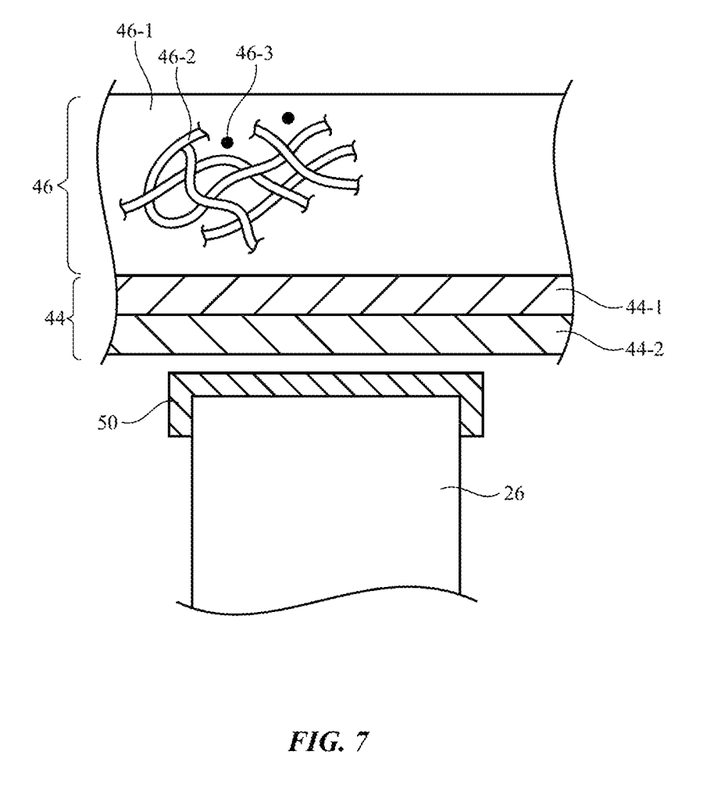
FIG. 7 is a cross-sectional side view of a portion of a shielding structure having a conductive fabric cover showing how an insulating layer such as a sheet of adhesive-backed polymer and an optional polymeric component cover may provide insulation and separation between an electrical component and the interior surface of the conductive fabric cover in accordance with an embodiment.

FIG. 7 is a cross-sectional side view of a central portion of shield 34 that includes conductive fabric 46. In the example of FIG. 7, conductive fabric 46 includes conductive particles 46-3 (e.g., metal particles, or other conductive particles) and intertwined fibers 46-2. Fibers 46-2 and the conductive material of particles 46-3 may be embedded within polymer binder 46-1. Metal particles 46-3 may be formed from metals such as silver, copper, nickel, or other metals. The metal of the frame of shield 34 to which fabric 46 is shorted may be formed from a nickel copper alloy or other metal. Insulating layer 44 may be formed from adhesive layer 44-1 and polymer layer 44-2. Adhesive layer 44-1 may be used to attach an insulating sheet of material such as layer 44-2 to the inner surface of fabric 46.

An optional insulating cap such as cap 50 may be formed on top of one or more of the components under shield 34. Cap 50 may be formed from a layer of insulating material such as silicone or other polymer that is able to withstand heat generated by component 26 during operation (e.g., an elastomeric polymer, etc.). The edges of cap 50 may cover the upper portions of the sides of components 26 or cap 50 may be formed from a layer of insulating material that does not significantly extend down the sides of components 26.

In addition to or as an alternative to forming shield 34 from conductive fabric attached to a peripheral metal frame, shield 34 may be formed by combining shielding can structures with other metal structures in device 10. As an example, shield 34 may have a first portion that is formed from a shielding can structure (or a metal frame with a fabric cover) and a second portion that is formed using part of a metal structure such as a shield for a subscriber identity module (SIM) card. In wireless devices such as cellular telephones and portable computers, SIM cards are used to authenticate wireless users to a wireless service provider. Metal shield structures are used to hold and shield SIM cards within the housing of an electronic device. By combining a SIM card shield with an adjacent shielding can, overall shielding structure volume for a given amount of shielded area may be reduced, because intervening sidewall structures can be minimized or eliminated.

Figure 8:
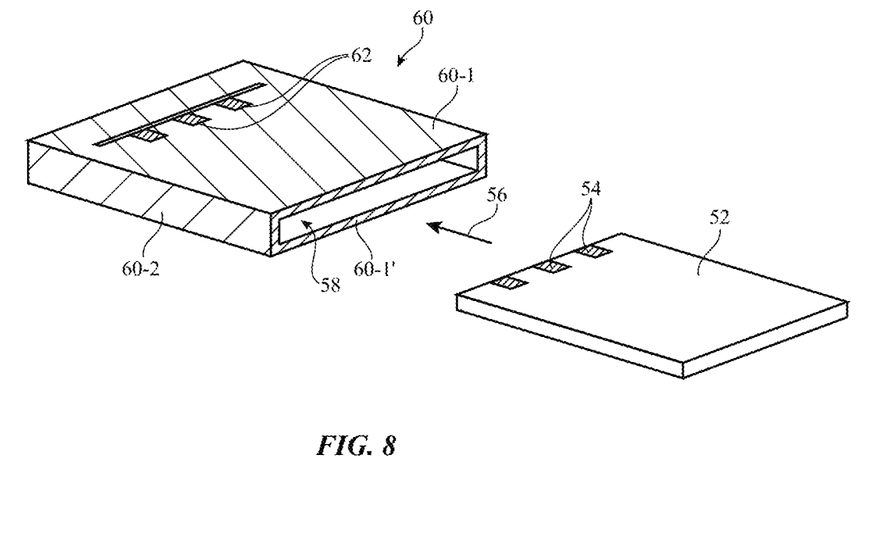
FIG. 8 is a perspective view of an illustrative metal structure such as a subscriber identity module (SIM) card shield that may receive a SIM card or other mating component in accordance with an embodiment.

An illustrative SIM card and SIM card shield structure are shown in FIG. 8. As shown in FIG. 8, when SIM card 52 is inserted into an opening in a SIM card shielding structure such as opening 58 in SIM card shield 60, SIM card contacts 54 will mate with corresponding SIM card shield contacts 62. Control circuitry 16 may have signal paths coupled to contacts 62 to support communications with the circuitry of SIM card 52. SIM card shield 60 may have vertical sidewalls such as sidewalls 60-2. Upper wall 60-1 may be formed from a planar sheet of metal. An opposing lower wall may be formed for shield 60 such as lower wall 60-1' or lower wall 60-1' may be omitted (e.g., to permit soldering of sidewalls 60-2 directly to a printed circuit board such as printed circuit 24. If desired, other configurations may be used for shield 60. The illustrative box shape of FIG. 8 is merely illustrative.

Figure 9:
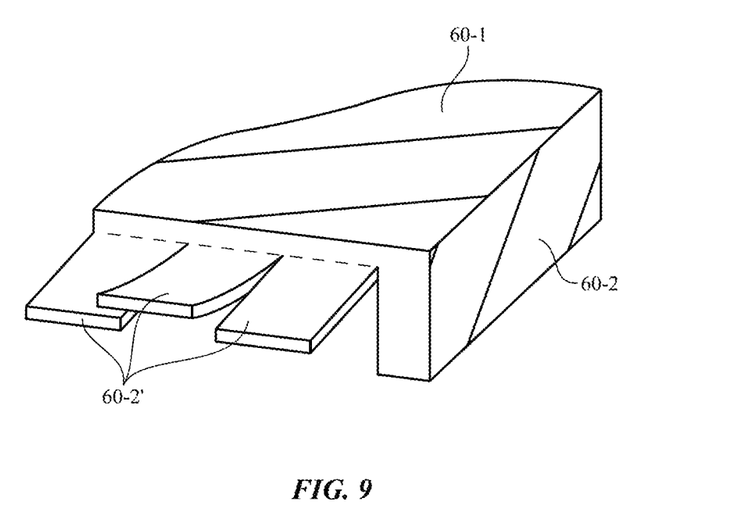
FIG. 9 is a perspective view of the illustrative SIM card shield of FIG. 9 showing how portions of the wall of the receptacle may be configured to form laterally protruding tabs in accordance with an embodiment.

Shield 60 may be configured to mate with an adjacent shield can, thereby forming an area-efficient hybrid shield for components 26. A perspective view of an illustrative SIM card shielding structure that has portions for mating with an adjacent shield can is shown in FIG. 9. As shown in FIG. 9, SIM card shield 60 may have a planar upper surface such as surface 60-1 surrounded on some or all sides by sidewalls 60-2. Along one or more of the sidewalls of shield 60, horizontally protruding bent tabs 60-2' may be formed to engage with corresponding portions of a component shield can. Tabs 60-2' may be formed by cutting and bending sidewalls portions of shield 60 upwards to form horizontal protrusions from shield 60. In the example of FIG. 9, oddly numbered tabs 60-2' are bent upward slightly less than evenly numbered tabs 60-2', which allows a portion of an adjacent shield can to be sandwiched between the even and odd tabs.

Figure 10:
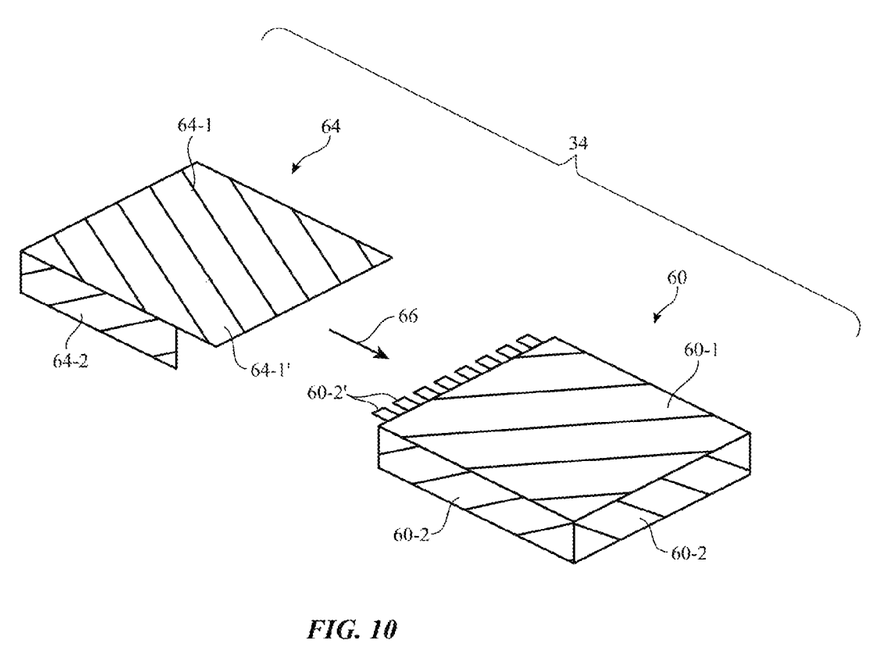
FIG. 10 is an exploded perspective view of an illustrative SIM card receptacle having laterally protruding tabs that mate with a laterally extending portion of a shield can or other shield structure to form a shield in accordance with an embodiment.

Consider, as an example, the configuration of FIG. 10. As shown in FIG. 10, shield 34 may be formed by joining SIM card shield 60 with component shielding can 64. Shield can 64 may have a horizontally extending planar upper wall such as wall 64-1. Sidewalls 64-2 may extend vertically downward and may be soldered to printed circuit 24. One of the sidewalls of shield 64 (e.g., the sidewall facing SIM card shield tabs 60-2') may be bent upwards (e.g., from vertical to horizontal), thereby forming extended horizontal wall portion 64-1'. In the example of FIG. 10, shield can 64 has one horizontally protruding edge (horizontally protruding upper wall portion 64-1') and SIM card shield 60 has mating tabs 60-2' for receiving this one protruding edge when shield can 64 is moved towards SIM card shield 60 in direction 66. If desired, other configurations may be used for forming a hybrid shield having joined SIM card shield and shielding can structures (e.g., configurations in which shield 64 and shield 60 are joined along part of a single edge or are joined along all or part of two or more edges, configurations in which tabs are formed on shield 64 that mate with a horizontally protruding portion of shield 60, etc.). The configuration of FIG. 10 is merely illustrative.

Figure 11:
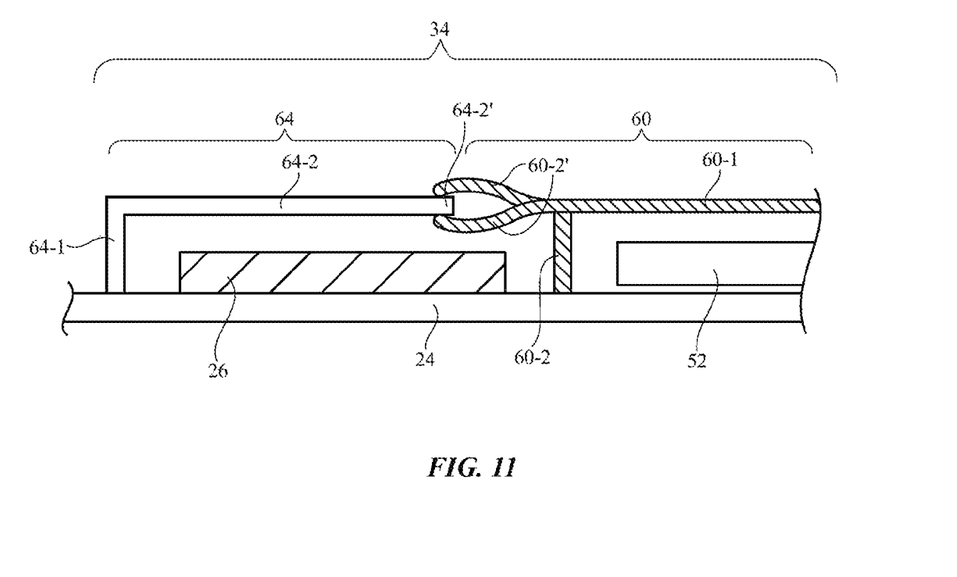
FIG. 11 is a cross-sectional side view of the mating shield can and SIM card receptacle of FIG. 10 in accordance with an embodiment.

FIG. 11 is a cross-sectional side view of shield 34 of FIG. 10 following mating of shield 64 and shield 60 by placing shield can wall protrusion 64-2' of upper shield wall 64-2 of shield can 64 between opposing upper and lower tabs 60-2' of shield 60. As shown in FIG. 11, shield 34 may be soldered to printed circuit 24 over component 26 and over SIM card 52. Tabs 60-2' and protrusion 64-2' may overlap components 26, thereby expanding the area available for shielding under shield 34. Space may be used efficiently, because intervening vertical wall structures between component 26 and SIM card 52 may be reduced or eliminated. For example, the vertical wall associated with the edge of can 64 that is adjacent to SIM card shield 60 may be omitted. Some or all of the vertical wall of shield 60 that is adjacent to shield can 64 (i.e., wall 60-2 in the example of FIG. 11) may also be omitted. For example, most or all of wall 60-2 may be bent upwards to form tabs 60-2' with only corner post portions of wall 60-2 remaining.

Figure 12:
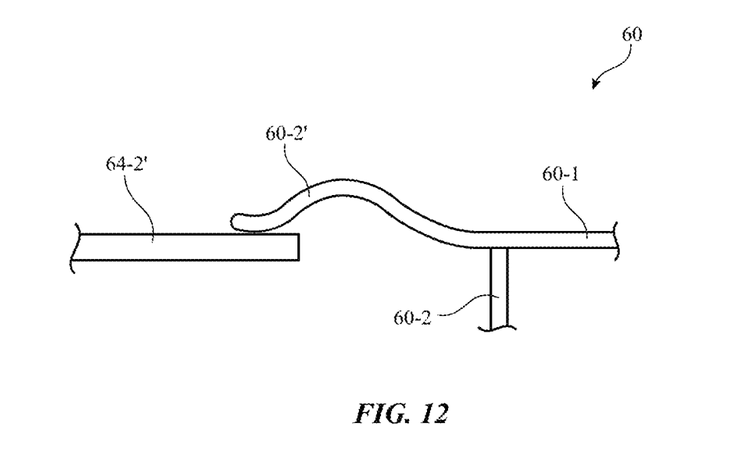
FIG. 12 is a cross-sectional side view of an illustrative shield can structure having a protruding portion with an upper surface that contacts a tab from a metal structure such as a SIM card receptacle in accordance with an embodiment.
Figure 13:
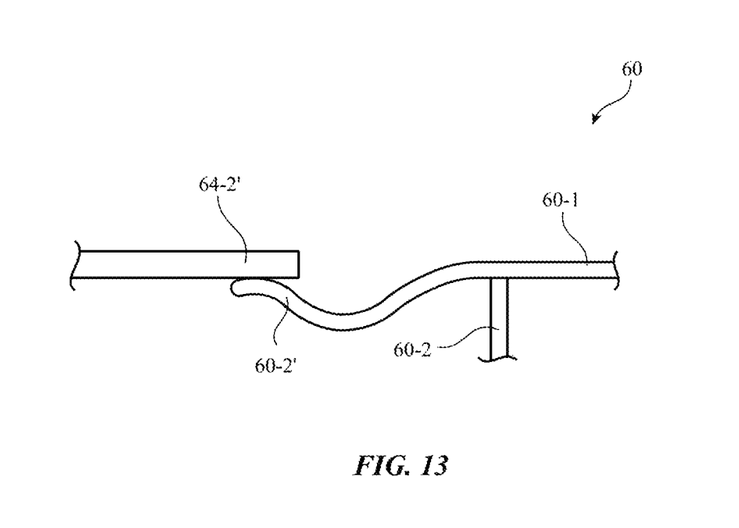
FIG. 13 is a cross-sectional side view of an illustrative shield can structure having a protruding portion with a lower surface that contacts a tab from a metal structure such as a SIM card receptacle in accordance with an embodiment.

It is not necessary to use both upper and lower horizontal tab protrusions from shield 60 to mate with shield can 64. FIG. 12 is a cross-sectional side view of protrusion 64-2' mating with a series of upper tabs 60-2' (or a single upper tab) in a configuration in which no lower tabs are used. FIG. 13 is a cross-sectional side view of protrusion 64-2' mating with a series of lower tabs 60-2' (or a single lower tab) in a configuration in which no upper tabs are used. In general, tabs may be formed on shield 64, shield 60, and/or portions of both shield 60 and 64, may be upwardly bent and downwardly bent tabs, and/or may include only lower tabs or only upper tabs.

Figure 14:
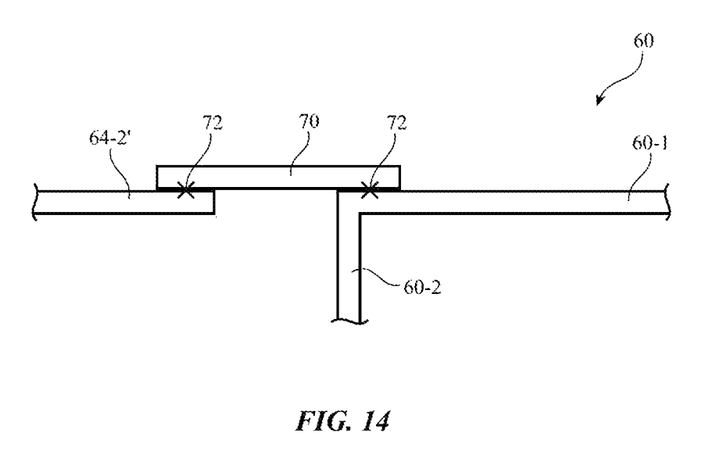
FIG. 14 shows how a welded metal sheet may be used to join a metal structure such as a SIM card receptacle with a laterally extending shield can wall to form an electromagnetic shield in accordance with an embodiment.

In the example of FIG. 14, horizontal sheet metal plate 70 has been welded between a portion of shield 64 (e.g., horizontally extending wall portion 64-2') and an adjacent portion of shield 60 (e.g., upper wall 60-1). Connections 72 may be welds formed using laser welding or other welding techniques. Solder or other conductive materials may also be used to form connections 72 to join portions 64-2' and 60-1. If desired, vertical wall 60-2 may be partly or completely removed to create more interior volume for shield 34 (e.g., wall 60-2 may be retained only at corner post locations). The portion of shield 60 to which the horizontal wall formed from sheet metal structure 70 is attached may, if desired, be a bent portion of wall 60-2 such as one or more tabs 60-2'. If desired, conductive fabric 46 or other conductive structures may be used to form horizontal planar wall 70 or other conductive bridging structure that couples adjacent edges of shields 64 and 60. Conductive adhesive may be used to attach the bridging structures and other shield structures. Hybrid shields such as shields formed using shielding can and SIM card shield structures may, if desired, have upper wall openings (in the component shield and/or in the SIM card shield) that are covered with fabric 46, as described in connection with FIG. 6.

The foregoing is merely illustrative and various modifications can be made by those skilled in the art without departing from the scope and spirit of the described embodiments. The foregoing embodiments may be implemented individually or in any combination.

What is claimed is:

1. A shield for electromagnetically shielding components on a printed circuit, comprising:
    a metal frame having an opening;
    a conductive fabric that covers the opening; and
    an insulating layer on a surface of the conductive fabric, wherein the insulating layer is interposed between the components on the printed circuit and the conductive fabric.

2. The shield defined in claim 1 wherein the metal frame comprises four sidewalls and wherein the opening comprises a rectangular opening.

3. The shield defined in claim 2 further comprising conductive adhesive that attaches the conductive fabric to the metal frame.

4. The shield defined in claim 3 wherein the metal frame has planar upper metal wall portion that extends horizontally inwards from the four sidewalls and that surrounds the opening.

5. The shield defined in claim 4 wherein the conductive adhesive is attached between the planar upper metal wall portion and the conductive fabric.

6. The shield defined in claim 5 wherein the conductive fabric comprises intertwined fibers, metal particles, and a polymer binder in which the intertwined fibers and metal particles are embedded.

7. The shield defined in claim 5 wherein the planar upper metal wall portion has an inner surface of a first height and wherein the conductive fabric has an inner surface of a second height that is greater than the first height.

8. The shield defined in claim 1 wherein the insulating layer comprises a polymer layer and a layer of adhesive that attaches the polymer layer to the surface of the conductive fabric.

9. A shield for electromagnetically shielding components on a printed circuit, comprising:
    a shield can; and
    a subscriber identity module shield, wherein adjacent portions of the shield can and the subscriber identity module shield are joined together.

10. The shield defined in claim 9 wherein the shield can and subscriber identity module have at least one horizontal wall protrusion that mates with horizontally extending tabs.

11. The shield defined in claim 10 wherein the horizontally extending tabs comprise upper tabs and lower tabs and wherein the horizontal wall protrusion is received between the upper and lower tabs.

12. The shield defined in claim 10 wherein the horizontal wall protrusion protrudes outward from a horizontally extending planar upper wall of the shield can.

13. The shield defined in claim 10 wherein the horizontal wall protrusion protrudes outward from a horizontally extending planar upper wall of the subscriber identity module shield.

14. The shield defined in claim 9 further comprising a planar metal wall portion that is attached between the shielding can and the subscriber identity module shield.

15. The shield defined in claim 14 further comprising welds that attach the planar metal wall portion to the shielding can and to the subscriber identity module shield.

16. The shield defined in claim 9 further comprising conductive fabric that is attached between the shielding can and the subscriber identity module shield.

17. Apparatus, comprising:
    a printed circuit;
    electrical components soldered to the printed circuit;
    a first shield that electromagnetically shields the electrical components, wherein the first shield includes a first vertical metal wall that is soldered to the printed circuit and a first surface extending horizontally from the first vertical metal wall; and
    a second shield that electromagnetically shields an additional electronic component, wherein the second shield includes a second vertical metal wall and a second surface extending horizontally from the second vertical metal wall, and the second surface has tabs configured to attach the second surface to the first surface.

18. The apparatus defined in claim 17 wherein the tabs comprise upper and lower tabs, and the first surface is interposed between the upper and lower tabs when the second surface is attached to the first surface.

* * * * *